(12) United States Patent
Suzuki et al.

(10) Patent No.: US 7,300,744 B2
(45) Date of Patent: Nov. 27, 2007

(54) METHOD OF PROCESSING LIGHT SENSITIVE PLANOGRAPHIC PRINTING PLATE MATERIAL

(75) Inventors: Toshitsugu Suzuki, Hachioji (JP); Taro Konuma, Fuchu (JP)

(73) Assignee: Konica Minolta Medical & Graphic, Inc. (JP)

( * ) Notice: Subject to any disclaimer, the term of this patent is extended or adjusted under 35 U.S.C. 154(b) by 0 days.

(21) Appl. No.: 11/135,036

(22) Filed: May 23, 2005

(65) Prior Publication Data

US 2005/0266350 A1 Dec. 1, 2005

(30) Foreign Application Priority Data

May 27, 2004 (JP) ............................. 2004-157291

(51) Int. Cl.
*G03F 7/30* (2006.01)
*G03F 7/32* (2006.01)
*G03F 7/40* (2006.01)

(52) U.S. Cl. .................... 430/302; 430/309; 430/331; 430/964

(58) Field of Classification Search ............ 430/270.1, 430/281.1, 288.1, 302, 331, 434, 435, 309, 430/964
See application file for complete search history.

(56) References Cited

U.S. PATENT DOCUMENTS

| | | | | |
|---|---|---|---|---|
| 4,349,391 | A | * | 9/1982 | Schell ........................ 148/250 |
| 4,786,581 | A | * | 11/1988 | Stahlhofen et al. ......... 430/331 |
| 5,021,324 | A | * | 6/1991 | Jargiello et al. ............ 430/331 |
| 2002/0092436 | A1 | * | 7/2002 | Tsuchiya et al. ......... 101/450.1 |
| 2004/0096777 | A1 | * | 5/2004 | Tsuchiya et al. ............ 430/302 |
| 2004/0170931 | A1 | * | 9/2004 | Suzuki ....................... 430/331 |
| 2005/0037286 | A1 | * | 2/2005 | Hirabayashi et al. .... 430/281.1 |

FOREIGN PATENT DOCUMENTS

| | | |
|---|---|---|
| EP | 0 943 967 A2 | 9/1999 |
| EP | 1 260 866 A2 | 11/2002 |
| EP | 1260 867 A1 | 11/2002 |

OTHER PUBLICATIONS

European Search Report for Application No. 05104245.5-2222 dated Sep. 29, 2005.
Database WPI, Derwent Publications Ltd., XP-002345233, Section Ch, Week 200436 for JP 2004-077589 dated Mar. 11, 2004.

* cited by examiner

*Primary Examiner*—Richard L. Schilling
(74) *Attorney, Agent, or Firm*—Cantor Colburn LLP

(57) ABSTRACT

Disclosed is a method of processing a light sensitive planographic printing plate material comprising an aluminum support, and provided thereon, a photopolymerizable light sensitive layer containing a polymerizable ethylenically unsaturated compound, a photopolymerization initiator, and a polymer binder, the method comprising the steps of imagewise exposing the light sensitive planographic printing plate material, developing the exposed light sensitive planographic printing plate material with a developer to obtain a planographic printing plate, the developer containing no silicate or containing a silicate in amount of not more than 0.1% by weight in terms of $SiO_2$, and plate processing the resulting planographic printing plate with a plate protecting solution containing a phosphonic acid compound at a temperature of from 40 to 90° C.

16 Claims, No Drawings

METHOD OF PROCESSING LIGHT SENSITIVE PLANOGRAPHIC PRINTING PLATE MATERIAL

This application is based on Japanese Patent Application No. 2004-157291 filed on May 27, 2004 in Japanese Patent Office, the entire content of which is hereby incorporated by reference.

FIELD OF THE INVENTION

The present invention relates to a method of processing a light sensitive planographic printing plate material, and particularly to a method comprising the step of imagewise exposing and developing a photopolymerization type light sensitive planographic printing plate material to obtain a planographic printing plate, and then plate processing the planographic printing plate with a plate protecting solution.

BACKGROUND OF THE INVENTION

In printing industries, an off-set printing method is widely carried out which employs a planographic printing plate obtainable from a light sensitive planographic printing plate material. In the off-set printing method, printing is carried out employing a planographic printing plate which is obtained by imagewise exposing a light sensitive planographic printing plate material, and developing the exposed printing plate material to form, on the planographic printing plate, image portions which receive printing ink and non-image portions which receive dampening water and repel printing ink. The resulting planographic printing plate is plate processed with a plate protecting solution before or during printing in order to protect the surface of the printing plate.

Thus, the plate processing may maintain hydrophilicity of the non-image portions for a period from development until printing, to prevent stain or scratch produced due to fingerprint, oil and fat or dust which may be deposited on the plate surface while correction such as rewriting or erasing is carried out or the printing plate is handled, for example, it is mounted on a plate cylinder of a printing press, and to prevent stain due to oxidation of the non-image portions after relatively long term storage.

Hitherto, an aqueous solution of gum arabic, cellulose gum, or a water-soluble resin having a carboxyl group in the molecule has been used as the plate protecting solution.

In addition to the above, a plate protecting solution containing a phosphoric acid-modified starch is disclosed in Japanese Patent O.P.I. Publication No. 62-11693, and a plate protecting solution containing a carboxyalkylated starch is disclosed in Japanese Patent O.P.I. Publication Nos. 62-7595. Further, a plate protecting solution containing phosphoric acid or its derivatives (including phosphonic acid) are known (see Japanese Patent O.P.I. Publication No. 62-11693.).

A plate protecting solution containing a polyoxyethylene-containing surfactant is proposed (see Japanese Patent O.P.I. Publication No. 11-265074), a plate protecting solution containing a hydrocarbon with a specific chemical structure is proposed (see Japanese Patent O.P.I. Publication No. 11-288106), a plate protecting solution containing a soybean polysaccharide and an aldehyde compound is proposed (see Japanese Patent O.P.I. Publication No. 2003-182256), and further, a plate protecting solution is known in which a phosphonic compound is added as a chelating agent to these plate protecting solutions.

As a support of a light sensitive planographic printing plate material, one having high hydrophilicity, high water retention property, and excellent adhesion to the light sensitive layer is desired, and an aluminum plate whose surface is subjected to roughening treatment is generally used. For a developer for a printing plate material with an aluminum support, a developer containing silicate has been used in view of pH buffering effect or hydrophilization effect, however, sludge, which causes stain on the developed printing plate material, may be produced in the developer when a large number of printing plate materials are developed. A developer, which does not substantially contain silicate, is known (see Japanese Patent O.P.I. Publication No. 2002-351094), but it is not satisfactory in minimizing stain occurrence.

As a light sensitive layer, a light sensitive containing a polymerizable ethylenically unsaturated compound is known. A photopolymerization type light sensitive planographic printing plate material, in which such a light sensitive layer is provided on the aluminum support, is advantageously used in view of high sensitivity or printing durability.

The photopolymerization type light sensitive planographic printing plate material provides high sensitivity as described above. However, when a large number of photopolymerization type light sensitive planographic printing plate materials are developed employing a conventional automatic developing machine to prepare a large number of printing plates, and printing is carried out employing the resulting printing plate, suspended, and resumed, stain is likely to occur at non-image portions of the printing plate. Even a printing plate, which has been plate processed with the plate protecting solutions as described above, is insufficient in preventing such stain occurrence.

In recent years, environmental protection has been sought also in the printing industries, and printing ink containing no petroleum type volatile organic compound (VOC) has been developed and used. When such a printing ink is employed, it is especially difficult to prevent stain occurrence as described above.

SUMMARY OF THE INVENTION

The invention may provide a method of processing a light sensitive planographic printing plate material to obtain a planographic printing plate, the method minimizing stain at non-image portions of prints when printing is carried out employing the planographic printing plate.

DETAILED DESCRIPTION OF THE INVENTION

1. A method of processing a light sensitive planographic printing plate material comprising an aluminum support, and provided thereon, a photopolymerizable light sensitive layer containing a polymerizable ethylenically unsaturated compound, a photopolymerization initiator, and a polymer binder, the method comprising the steps of imagewise exposing the light sensitive planographic printing plate material, developing the exposed light sensitive planographic printing plate material with a developer to obtain a planographic printing plate, the developer containing no silicate or containing a silicate in an amount of not more than 0.1% by weight in terms of $SiO_2$, and plate processing the resulting planographic printing plate with a plate protecting solution containing a phosphonic acid compound at a temperature of from 40 to 90° C.

2. The method of item 1 above, wherein the plate protecting solution contains two or more kinds of phosphonic acid compounds having different molecular weights.

3. The method of item 1 above, wherein the phosphonic acid compound is a polyvinyl phosphonic acid or a phosphonic acid-modified starch.

4. The method of item 3. above, wherein the molecular weight of the polyvinyl phosphonic acid and phosphonic acid-modified starch is not less than 2000.

5. The method of item 1 above, wherein the phosphonic acid compound is an acid selected from the group consisting of (1) a nitrilotris-methylene-phosphonic acid compound, (2) a phosphonoalkanepolycarboxylic acid compound, (3) a hydroxyalkanepolyphosphonic acid compound and (4) an alkanepolyaminepolymethylenephosphonic acid compound.

6. The method of item 5 above, wherein the molecular weight of the acid has a molecular weight of less than 2000.

7. The method of item 2 above, wherein the plate protecting solution contains a polyvinyl phosphonic acid or a phosphonic acid-modified starch each having a molecular weight of not less than 2000, and an acid selected from the group consisting of (1) a nitrilotris-methylene-phosphonic acid compound, (2) a phosphonoalkanepolycarboxylic acid compound, (3) a hydroxyalkanepolyphosphonic acid compound and (4) an alkanepolyaminepolymethylenephosphonic acid compound each having a molecular weight of less than 2000.

8. The method of item 1 above, wherein the plate protecting solution contains the phosphonic acid compound in an amount of from 0.001 to 5% by weight.

9. The method of item 8 above, wherein the plate protecting solution contains the phosphonic acid compound in an amount of from 0.005 to 2% by weight.

10. The method of item 1 above, wherein the plate protecting solution contains a hydrophilic polymer compound.

11. The method of item 1 above, wherein the plate protecting solution has a pH of from 2 to 7.

12. The method of item 1 above, after the plate processing, further comprising the step of drying the plate processed planographic printing plate at from 35 to 200° C. to form a plate protection layer with a dry thickness of from 0.1 to 1.0 g/m².

13. The method of item 1 above, wherein the developer is an aqueous alkaline solution with a pH of from 8.5 to less than 13.0.

14. The method of item 13 above, wherein the developer is an aqueous alkaline solution with a pH of from 8.5 to 12.

15. The method of item 13 above, wherein the developer is replenished with a developer replenisher having a pH higher than that of the developer.

16. The method of item 1 above, wherein the developer contains a surfactant having an oxyalkylene group.

17. The method of item 16 above, wherein the surfactant is an anionic surfactant having an oxyethylene group and a hydrophobic group including an alkyl group, in which the molecular weight of the alkyl group is not more than 25% of the molecular weight of the hydrophobic group; a nonionic surfactant having an oxyethylene group and a hydrophobic group including an alkyl group, in which the molecular weight of the alkyl group is not more than 25% of the molecular weight of the hydrophobic group; or a surfactant represented by the following formula:

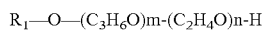

$R_1$—O—$(C_3H_6O)_m$-$(C_2H_4O)_n$-H wherein $R_1$ represents a substituted or unsubstituted alkyl group or a substituted or unsubstituted aryl group; m represents an integer of from 1 to 3; and n represents an integer of from 2 to 30.

18. The method of item 1 above, wherein the polymerizable ethylenically unsaturated compound is a reaction product of a tertiary amine having two or more hydroxyl groups in the molecule, a diisocyanate, and a compound having a hydroxyl group and an addition polymerizable ethylenically double bond in the molecule; the polymerization initiator is selected from a dibromomethyl group-containing compound, a tribromomethyl group-containing compound, a titanocene compound, a monoalkyltriaryl borate compound, and an iron arene complex; and the polymer binder has an acid value of from 10 to 150.

19. The method of item 1 above, wherein an oxygen-shielding layer, containing polyvinyl alcohol or polyvinyl pyrrolidone, is provided on the photopolymerizable light sensitive layer.

The present invention will be detailed below.

The method of the invention is characterized in that a light sensitive planographic printing plate material comprising a photopolymerizable light sensitive layer is imagewise exposed, developed with a developer containing no silicate or containing a silicate in an amount of not more than 0.1% by weight in terms of $SiO_2$, and then plate processed with a plate protecting solution containing a phosphonic acid compound at from 40 to 90° C.

In an embodiment of the invention, the light sensitive planographic printing plate material in the invention is imagewise exposed, developed with the developer as above, and then plate processed with a plate protecting solution containing a phosphonic acid compound at a temperature of from 40 to 90° C. to obtain a planographic printing plate. The planographic printing plate, which is obtained by plate processing as above, minimizes stain at its non-image portions, which is likely to occur when printing is temporarily stopped and printing is restarted, or which is produced due to sludge produced in the developer.

The plate processing is carried out at a temperature of from 40 to 90° C. The plate processing is carried out at preferably from 45 to 65° C. in that hydrophilization at non-image portions and processing stability is enhanced.

In an embodiment of the invention, the phosphonic acid compound (hereinafter also referred to as the phosphonic acid compound in the invention) is a compound having a phosphonic acid group or a group derived therefrom or its salts. As the group derived therefrom, there are, for example, a phosphonic acid salt group and a phosphonic acid ester group.

In an embodiment of the invention, when the phosphonic acid compound is a polymeric compound, its molecular weight shows a number average molecular weight.

The phosphonic acid compound in the invention will be explained below.

Phosphonic Acid Compound (A) having a Molecular Weight Less Than 2,000

Examples of the phosphonic acid compound having a molecular weight less than 2,000 include a nitrilotris-methylene-phosphonic acid compound such as aminotri(methylene phosphonic acid); an alkane polyamine poly(methylene phosphonic acid) such as ethylenediaminetetra(methylene phosphonic acid), diethylenetriaminepenta(methylene phosphonic acid), triethylenetetraminehexa(methylene phosphonic acid), or hydroxyethylethylenediaminetri(methylene phosphonic acid); a phosphonoalkane polycarboxylic acid compound; and a hydroxyalkane polyphosphonic acid compound such as 1-hydroxyethane-1,1-diphosphonic acid (including its sodium, potassium or ammonium salt), which are preferably used.

Among the phosphonic acid compounds having a molecular weight less than 2,000, a phosphonic acid compound having a molecular weight of less than 1,000 is preferred, and a phosphonic acid compound having a molecular weight of not more than 500 is more preferred. A combination of the phosphonic acid compound having a molecular weight of less than 1,000 and the phosphonic acid compound having a molecular weight of not more than 500 is still more preferred.

Phosphonic Acid Compound (B) having a Molecular Weight of Not Less Than 2,000

Examples of the phosphonic acid compound having a molecular weight of not less than 2,000 include polyvinyl phosphonic acid, a phosphonic acid-modified starch in which a hydroxyl group in the glucose unit is reacted with phosphonic acid (or its derivative) to form an ester, a phosphonic acid-modified cellulose, phosphonic acid derivative polyacrylic acid, and a polymeric compound having a phosphonic acid group or a group derived therefrom in the main or side chain.

The plate protecting solution contains preferably two or more kinds of kinds of phosphonic acid compounds having different molecular weights, and more preferably a mixture of the compounds A and B described above.

As a phosphonic acid compound having a relatively high molecular weight, polyvinyl phosphonic acid or a phosphonic acid-modified starch is preferably used.

As a phosphonic acid compound having a relatively low molecular weight, a nitrilotris-methylene-phosphonic acid compound, a phosphonoalkanepolycarboxylic acid compound, a hydroxyalkanepolyphosphonic acid, or an alkanepolyamine polymethylene phosphonic acid is preferably used.

The content of the phosphonic acid compound in the plate protecting solution is preferably from 0.001 to 5% by weight, and more preferably from 0.01 to 0.3% by weight.

The pH of the plate protecting solution in the invention is preferably from 2 to 7, and more preferably 2 to 5, in view of easiness to eliminate a formed plate protection layer from a planographic printing plate during printing, safety during processing, or storage stability.

An imagewise exposed light sensitive planographic printing plate material is developed and post-processed with aqueous solutions such as a washing water, an aqueous solution ordinarily containing a surfactant called a rinsing solution, and an aqueous solution containing gum arabic or starch derivatives called a finisher or a gumming solution. The plate protecting solution in the invention can be any of the above aqueous solutions containing the phosphonic acid compound in the invention.

In an embodiment of the invention, the post-processing can be carried out, employing an appropriate combination of these aqueous solutions. For example, development, washing with washing water, and processing with a rinsing solution containing a surfactant are carried out in that order, or development, washing with washing water, and processing with a finisher are carried out in that order. Washing with washing water is preferred in that the rinsing solution or finisher used in a process following the washing is less fatigued. It is preferred that a cascaded counter-current processing is carried out employing a rinsing solution or a finisher.

The post-processing is carried out employing an automatic developing machine having a development section and a post-processing section. In the post-processing step, the developed printing plate material is sprayed with the post-processing solution from a spray nozzle or is immersed into the post-processing solution in a post-processing tank. A method (use-and-discard method) can be applied in which the developed planographic printing plate material is processed with a fresh processing solution and discarded.

The thus obtained planographic printing plate is mounted on a printing press, and printing is carried out.

The advantageous effect of the invention is exhibited when using, during printing, printing ink for environmental protection containing no petroleum volatile organic compound (VOC) (for example, soybean oil ink "Naturalith 100" produced by Dainippon Ink Kagaku Kogyo Co., Ltd, VOC zero ink "TK Hy Eco SOY 1" produced by Toyo Ink Manufacturing Co., Ltd., and process ink "Soycelvo" produced by Tokyo Ink Co., Ltd.).

(Plate Protecting Solution)

The plate processing solution in the invention is an aqueous solution containing a phosphonic acid compound. The plate processing can contain a hydrophilic polymer compound. The plate processing solution can further contain an acid to remove alkaline ingredients contained in the developer which remain on a printing plate, a buffering agent, a surfactant, a chelating agent, a lubricant, an antiseptic or a solubilizing agent.

As the hydrophilic polymer compound, any hydrophilic polymer, which has been usable in a conventional gum solution, is suitably usable. Examples thereof include gum arabic, dextrin, white dextrin, starch or its derivative (for example, hydroxypropyl starch), cellulose derivatives (e.g., carboxymethyl cellulose, carboxyethyl cellulose, methyl cellulose) and their modified compounds, polyvinyl alcohol and its derivatives, polyvinyl:pyrrolidone, polyacrylamide and its copolymers, poly[(vinyl methyl ether)-co-(anhydrous maleic acid)], poly[(vinyl acetate)-co-(anhydrous maleic acid)], and poly[styrene-co-(anhydrous maleic acid)].

As the surfactant, an anionic surfactant and/or a nonionic surfactant can be used. Examples of the anionic surfactant include fatty acid salts, abietic acid salts, hydroxyalkanesulfonic acid salts, alkanesulfonic acid salts, dialkylsulfosuccinic acid salts, straight chain alkylbebzenesulfonic acid salts, branched alktlbebzenesulfonic acid salts, alkylnaphthalenesulfonic acid salts, alkylphenoxypolyoxyethylene propylsulfonic acid salts, polyoxyethylene alkylsulfophenyl ether, polyoxyethylene aryl ether sulfonic acid salts, polyoxyethylene-naphthyl ether sulfonic acid salts, N-methyl-N-oleyltaurine sodium salts, petroleum sulfonic acid salts, nitrated castor oil, sulfated tallow oil, fatty acid alkyl ester sulfuric acid ester salts, alkylnitrates, polyoxyethylene alkyl ether sulfuric acid ester salts, fatty acid monoglyceride sulfate ester salts, polyoxyethylene alkylphenyl ether sulfuric acid salts, alkylphosphate ester salts, polyoxyethylene alkyl ether phosphoric acid ester salts, polyoxyethylene alkylphenyl ether phosphoric acid ester salts, partially saponified styrene anhydrous maleic acid copolymer, partially saponified olefin-anhydrous maleic acid copolymer, and naphthalenesulfonic acid salt-formaline condensates. Of the foregoing, dialkylsulfosuccinic acid salts, alkylsulfates and alkylnaphthalenesulfonic acid salts are preferred.

Examples of the nonionic surfactant include polyoxyethylene alkyl ethers, polyoxyethylene alkylphenyl ethers, polyoxyethylene-polyoxypropylene block polymers, polyoxyethylene aryl ethers, polyoxyethylene naphthyl ethers, polyoxyethylene polystyrylphenyl ethers, polyoxyethylene polyoxypropylene alkyl ethers, glycerin fatty acid partial esters, sorbitan fatty acid partial esters, pentaerythritol fatyy acid partial esters, propylene glycol monofatty acid esters, sugar fatty acid partial esters, polyoxuethylen sorbitan fatty acid partial esters, polyoxyethylene sorbitol fatty acid partial esters, polyethylene glycol fatty acid partial esters, polyglycerin fatty acid partial esters, polyoxyethylene-modified caster oils, polyoxyethylene grycerin fatty acid partial esters, fatty acid diethanolamides, N,N-bis-2-hydroxyalkylamines, polyoxyethylene alkylamine, triethanolamine fatty acid esters and trialkylamineoxides. Of the foregoing, polyoxyethylene alkylphenyl ethers and polyoxyethylene-polyoxypropylene block polymers are preferred.

There are also usable fluorinated or silicone-type anionic or nonionic surfactants. The surfactants may be used as a mixture of two or more kinds thereof. For example, a combination of at least two different anionic surfactants or a combination of at least one anionic surfactant and at least one nonionic surfactant is preferred.

The surfactant content is not specifically limited, but is preferably 0.01 to 20% by weight of plate processing solution.

In addition to the above ingredients, the plate processing solution may contain, as a wetting agent, polyhydric alcohols, alcohols or aliphatic hydrocarbons. Preferred examples of the polyhydric alcohols include ethylene glycol diethylene glycol, triethylene glycol, propylene glycol, tetraethylene glycol, polyethylene glycol, glycerin, and sorbitol. Preferred alcohols include, for example, alkyl alcohols such as propyl alcohol, butyl alcohol, pentanol, hexanol, butanol, and octanol; and alcohols containing an aromatic ring, such as benzyl alcohol, phenoxyethanol, and phenylaminoethyl alcohol.

Examples of the aliphatic hydrocarbons include n-hexanol, methylamyl alcohol, 2-ethylbutanol, n-heptanol, 3-heptanol, 2-octanol, 2-ethylhexanol, nonanol, 3,5,5-trimethylhexanol, n-decanol, undecanol, n-dodecanol, trimethylnonyl alcohol, tetradecanol, heptadecanol, 2-ethyl-1,3-hexane diol, 1,6-hexane diol, 2,5-hexane diol, 2,4-hexane diol, 1,8-octane diol, 1,9-nonane diol, and 1,10-decane diol.

The wetting agent content of the plate processing solution is preferably from 0.1 to 10% by weight, and more preferably from 0.5 to 3.0% by weight.

The plate processing solution in the invention is advantageously used in the acidic range of a pH of 3 to 6. Mineral acids, organic acids or inorganic salts are added to the plate processing solution to adjust the pH to the range of 3 to 6, preferably in an amount of 0.01 to 2% by weight. Mineral acids include, for example, nitric acid, sulfuric acid, phosphoric acid and metaphosphoric acid.

Organic acids include, for example, citric acid, acetic acid, oxalic acid, malonic acid, p-toluenesulfonic acid, tartaric acid, malic acid, lactic acid, levulinic acid, phytic acid and organic phosphonic acid. Inorganic salts include, for example, magnesium nitrate, primary phosphate, secondary phosphate, nickel sulfate, sodium hexamethanate, and sodium tripolyphosphate. Mineral acids, organic acids and inorganic salts may be used alone or as a mixture of two or more kinds thereof.

The gumming solution used in the invention can contain antiseptics or defoaming agents. Examples of the antiseptics include phenol and its derivatives, formaline, imidazole derivatives, sodium dehydroacetate, 4-isothiazoline-3-one derivatives, benzoisothiazoline-3-one, benzotriazole derivatives, amidinoguanine derivatives, quaternary ammonium salts, derivatives of pyridine, quinoline and guanine, diazine, triazole derivatives, oxazole, and oxazine derivatives.

The preferred content of the antiseptics is a quantity capable of taking stable effect upon bacteria, mold or yeast, depending on the kind of bacteria, molds or yeast. The content is preferably 0.01 to 4% by weight, based on the working plate processing solution. Two or more antiseptics are preferably used as a mixture of two or more kinds thereof to take effects upon various kinds of bacteria or molds. Silicone defoaming agents are preferred as the defoaming agents, and any silicon-contained defoaming agent of emulsion type and solubilization type is usable. The defoaming agent is used in an amount of preferably from 0.01 to 1.0% by weight, based on the working plate processing solution.

Further, there may be added chelating agents. Preferred chelating agents include, for example, ethylenediaminetetraacetic acid and its sodium and potassium salts, diethylenetriaminepentaacetic acid and its sodium and potassium salts, triethylenetetraminehexaacetic acid and its sodium and potassium salts, ethylenediaminedisuccinic acid and its sodium and potassium salts, hydroxyethyl-ethylenediaminetriacetic acid and its sodium and potassium salts, nitrilotriacetic acid and its sodium and potassium salts, and organic phosphonic acids or phosphono-alkanecarboxylic acids, such as 1-hydroxyethane-1,1-diphosphonic acid and its sodium and potassium salts, aminotri(methylenephosphonic acid) and its sodium and potassium salts. Besides the foregoing sodium and potassium salts of chelating agents, organic amine salts are also effective. Chelating agents are selected from those which can be stably present in the gumming solution and is free from adverse effects on printing. The content of the chelating agents is preferably 0.001 to 1.0% by weight, based on the working plate processing solution.

In addition to the above ingredients, a lipophilicity-enhancing agent may be incorporated. Examples thereof include hydrocarbons such as turpentine oil, xylene, toluene, low heptane, solvent naphtha, kerosene, mineral spirit, petroleum fractions exhibiting a boiling point of ca. 120 to 250° C.; and plasticizers exhibiting a freezing point of 15° C. or less and a boiling point of 300° C. or more at 1 atmospheric pressure, including phthalic acid diesters such as dibutyl phthalate, diheptyl phthalate, di-n-octyl phthalate, di(2-ethylhexyl)phthalate, dinonyl phthalate, dodecyl vdilauryl phthalate, and butylbenzyl phthalate; dibasic fatty acid esters, such as dioctyl adipate, butylglycol adipate, dioctyl azelate, dibutyl sebacate, di(2-ethylhexyl)sebacate, and diocyl sebacate; epoxy-modified triglycerides such as epoxy-modified soybean oil; phosphoric acid esters such as tricresyl phosphate, trioctyl phosphate, and triscrolethyl phosphate; and benzoic acid esters such as benzyl benzoate.

Further, there are included saturated fatty acids such as caproic acid, enatoic acid, heralgonic acid, capric acid, undecylic acid, lauric acid, tridecylic acid, myristic acid, pentadecylic acid, palmitic acid, heptadecylic acid, stearic acid, nonadecanoic acid, arachic acid, behenic acid, lignoceric acid, cerotic acid, heptacosanoic acid, montanic acid, melissic acid, lacceric acid, and iso-valeric acid; and unsaturated fatty acids such as acrylic acid, crotonic acid, iso-crotonic acid, undecylenic acidpleic acid, elaidic acid, cetoleic acid, nilcaic acid, btecidinic acid, sorbic acid, linolic acid, linolenic acid, arachidonic acid, propiolic acid, stearolic acid, sardine oil, tariric acid, and licanic acid. Of the foregoing, a fatty acid which is liquid at 50° C. is more preferred, one having 5 to 25 carbons is still more preferred, and one having 8 to 21 carbons is most preferred. These lipophilicity-enhancing agents may be used alone or as a mixture of two or more kinds thereof. The content thereof is preferably 0.01 to 10%, and more preferably 0.05 to 5% by weight, based on the plate processing solution. The lipophilicity-enhancing agents may be incorporated through solution in the oil phase of a gum emulsion. Alternatively, they may be solubilized with the aid of a solubilizing agent.

In an embodiment of the invention, the solid concentration of the plate processing solution is preferably from 3 to 60 g/liter, and more preferably from 5 to 30 g/liter.

(Plate Processing)

In an embodiment of the invention, a planographic printing plate obtained by development of the planographic printing plate material is plate processed with the plate protecting solution at from 40 to 90° C. As the plate processing method, there is, for example, a method in which the surface of the planographic printing plate is brought into contact with the plate protecting solution having a temperature of from 40 to 90° C. As the contacting method, there is, for example, a dipping method or a spraying method.

(Drying Method)

In the invention, the planographic printing plate after plate processed is preferably dried. Drying is carried out at a temperature of preferably from 35 to 200° C., and more preferably from 40 to 90° C.

Drying time, during which drying is carried out, is preferably from 1 to 5 seconds. As a drying means, there are, for example, a hot-air dryer and a far infrared ray heater.

In an embodiment of the invention, the time from completion of coating the gumming solution to start of drying is preferably 3 seconds or less, and more preferably 2 seconds or less, in view of ink receptivity. In the plate processing, the planographic printing plate is coated with the plate protecting solution to form a plate protecting solution layer with a wet thickness of preferably from 0.5 to 20 g/m$^2$, and more preferably from 1 to 10 g/m$^2$, and dried to form a plate protection layer with a dry thickness of preferably from 0.05 to 1.0 g/m$^2$, and more preferably from 0.1 to 0.8 g/m$^2$.

The thickness of the plate protection layer on the planographic printing plate can be adjusted by controlling squeegeeing conditions of the squeegeeing means of an automatic developing machine used.

(Developer)

The developer in the invention is one containing no silicate or containing a silicate in amount of not more than 0.1% by weight in terms of SiO$_2$, and preferably an aqueous alkaline solution. The developer preferably contains weak acid compounds such as phosphoric acid, carbonic acid, boric acid, phenols, saccharides, oximes, or fluorinated alcohols.

The developer in the invention has a pH of preferably from 8.5 to less than 13.0, and more preferably from 8.5 to 12.

The weak acid compounds such as phenols, saccharides, oximes, and fluorinated alcohols as described above have an acid dissociation constant (pKa) of preferably from 10.0 to 13.2. Such acid compounds are selected from those described in "IONIZATION CONSTANTS OF ORGANIC ACIDS IN AQUEOUS SOLUTION" published by Pergamon Press Co. Ltd. Examples thereof include phenols having a phenolic hydroxyl group such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfosalicylic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27), and m-cresol (pKa: 10.09).

As the saccharides, non-reducing saccharides, which are stable in an alkali solution, are preferably used. The non-reducing saccharides are those which do not have a free aldehyde group or ketone group, and therefore do not have reducibility. They are classified into trehalose type oligosaccharides in which monosaccharides combine with each other through the reducing groups, glycosides in which saccharides combine with another compound through their reducing group, and sugar alcohols obtained by reducing saccharides, each of which can be suitably used in the invention. Examples of the trehalose type oligosaccharide include trehalose and saccharose. Examples of the glycosides include alkyl glycosides, phenol glycosides, and mustard oil glycoside. Examples of the sugar alcohols include D,L-arabitol, ribitol, xylitol, D,L-sorbitol, D,L-mannitol, D,L-iditol, D,L-talitol, D,L-dulcitol, and D,L-allodulcitol. Maltitol obtained by hydrogenation of disaccharides or reduced oligosaccharides (reduced starch syrup) obtained by hydrogenation of oligosaccharides are suitably used. Examples of the oximes include 2-butanoneoxime (pKa: 12.45), acetoxime (pKa: 12.42), 1,2-cycloheptanedioxime (pKa: 12.3), 2-hydroxybenzaldehideoxime (pKa: 12.10), dimethylglyoxime (pKa: 12.9), ethanediamidedioxime (pKa: 11.37), acetophenoneoxime (pKa: 11.35). Examples of the fluorinated alcohols include 2,2,3,3-tetrafluoropropanol-1 (pKa: 12.74), trifluoroethanol (pKa: 12.37), and trichloroethanol (pKa: 12.24). Further, aldehydes, nucleic acid related substances or other weak acids are used. Examples of the aldehydes include pyridine-2-aldehyde (pKa: 12.68) and pyridine-4-aldehyde (pKa: 12.05), Examples of the nucleic acid related substances include adenosine (pKa: 12.56), inosine (pKa: 12.5), guanine (pKa: 12.3), cytosine (pKa: 12.2), hypoxanthine (pKa: 12.1), and xanthine (pKa: 11.9). Examples of the other weak acids include diethylaminomethylsulfonic acid (pKa: 12.32), 1-amino-3,3,3-trifluorobenzoic acid (pKa: 12.29), isopropylidenedisulfonic acid (pKa: 12.10), 1,1-ethylidenediphosphonic acid (pKa: 11.54), 1,1-diethylidenedisulfonic acid-1-hydroxy (pKa: 11.52), benzimidazole (pKa: 12.86), thiobenzamide (pKa: 12.8), picolinthioamide (pKa: 12.55), and barbituric acid (pKa: 12.5). These acid compounds can be used singly or as a mixture of two or more thereof. Of these compounds, phosphoric acid, carbonic acid, sulfosalicylic acid, salicylic acid, sugar alcohol, and saccharose are preferred, and D-sorbitol, saccharose, and reduced starch syrup are particularly preferred, since they are inexpensive and show buffering action in appropriate pH regions.

These weak acid compounds are contained in the developer in an amount of preferably from 0.1 to 30% by weight, and more preferably from 1 to 20% by weight.

In the invention, alkali agents used in combination with the above acid compounds include sodium hydroxide, potassium hydroxide, ammonium hydroxide and lithium hydroxide. These alkali agents may be used singly or in combination.

Other examples of the alkali agents in the invention include potassium phosphate, sodium phosphate, lithium phosphate, ammonium phosphate, potassium hydrogenphosphate, sodium hydrogenphosphate, lithium hydrogenphosphate, ammonium hydrogenphosphate, potassium carbonate, sodium carbonate, lithium carbonate, ammonium carbonate, potassium hydrogencarbonate, sodium hydrogencarbonate, lithium hydrogencarbonate, ammonium hydrogencarbonate, potassium borate, sodium borate, lithium borate, and ammonium borate.

In order to adjust pH of the developer, sodium hydroxide, potassium hydroxide, ammonium hydroxide and lithium hydroxide can be used. Organic alkali agents, including monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine, are also used in combination with the above compounds.

The developer may contain a surfactant such as a nonionic surfactant, an anionic surfactant, a cationic surfactant, or an amphoteric surfactant.

The developer in the invention, even if it does not contain a silicate, provides high hydrophilization and high anti-stain property, as compared with a conventional one.

Examples of the nonionic surfactant include polyoxyethylenealkyl ethers, polyoxyethylenealkylphenyl ethers, polyoxyethylene-polystyrylphenyl ethers, polyoxyethylenepolyoxypropylenalkyl ethers, partial esters of glycerin and fatty acids, partial esters of sorbitan and fatty acids, partial esters of pentaerythritol and fatty acids, propylene glycol monofatty acid ester, partial esters of sucrose and fatty acids, partial esters of polyoxyethylenesorbitan and fatty acids, partial esters of polyoxyethylenesorbitol and fatty acids, esters of polyoxyethylene glycol and fatty acids, partial esters of polyglycerin and fatty acids, polyoxyethylene castor oil, partial esters of polyoxyethyleneglycerin and fatty acids, fatty acid diethanolamides, N,N-bis-2-hydroxyalkylamines, polyoxyethylenealkylamines, triethanolamine fatty acid esters, and trialkylamine oxides. The "polyoxyethylene" described above can be replaced with polyoxyalkylene such as polyoxymethylene, polyoxypropylene, or polyoxybutylene.

Examples of the anionic, cationic and amphoteric surfactants include fatty acid salts, abietic acid salts, hydroxyalkane sulfonic acid salts, alkane sulfonic acid salts, dialkylsulfosuccinic acid salts, straight-chained alkylbenzene sulfonic acid salts, branched alkylbenzene sulfonic acid salts, alkylnaphthalene sulfonic acid salts, alkylphenoxypolyoxyethylenepropyl sulfonic acid salts, polyoxyethylenealkyl sulfophenylether salts, N-methyl-N-oleiltaurine sodium salts, N-alkylsulfosuccinic acid monoamide disodium salts, petroleum sulfonic acid salts, nitrated castor oil, sulfated beef tallow, fatty acid alkyl ester sulfate salts, alkylsulfate salts, polyoxyethylenealkylethersulfate salts, fatty acid monoglyceride sulfate salts, polyoxyethylenealkylphenylethersulfate salts, polyoxyethylene-stytylphenylethersulfate salts, alkylphosphate salts, polyoxyethylenealkyletherphosphate salts, polyoxyethylenealkylphenyletherphosphate salts, partial saponification products of styrene-maleic anhydride copolymers, partial saponification products of olefin-maleic anhydride copolymers, and condensates of naphthalene sulfonic acid salts with formalin, alkylamine salts, quaternary ammonium salts such as tetrabutylammonium bromide, polyoxyethylene alkylamine salts, polyethylene polyamine derivatives, carboxybetains, amino carboxylic acids, sulfobetaines, aminosulfates and imidazolines. These surfactants can be used singly or as a mixture of two or more thereof.

It is preferred that the developer in the invention further contains a surfactant having an oxyalkylene group, showing the advantageous effect of the invention.

As the surfactant having an oxyalkylene group, there are the following compounds A, B and C.

Compound A:

Anionic surfactant having an oxyethylene group and a hydrophobic group including an alkyl group in which the molecular weight of the alkyl group is not more than 25% of the molecular weight of the hydrophobic group.

Compound B:

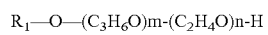

wherein $R_1$ represents a substituted or unsubstituted alkyl group or a substituted or unsubstituted aryl group; m represents an integer of from 1 to 3; and n represents an integer of from 2 to 30.

Compound C:

Nonionic surfactant having an oxyethylene group and a hydrophobic group including an alkyl group in which the molecular weight of the alkyl group is not more than 25% of the molecular weight of the hydrophobic group.

Examples of the compounds A, B and C will be listed below.

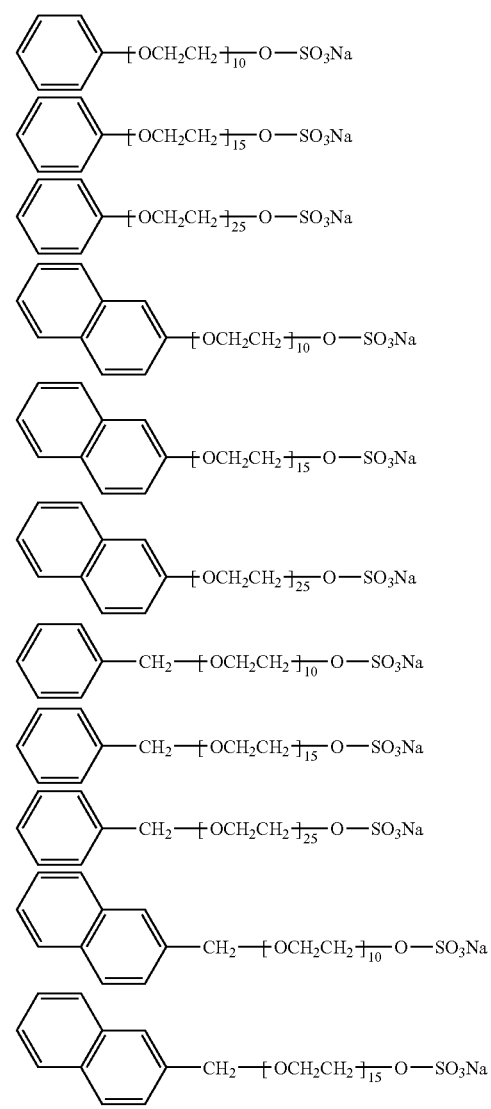

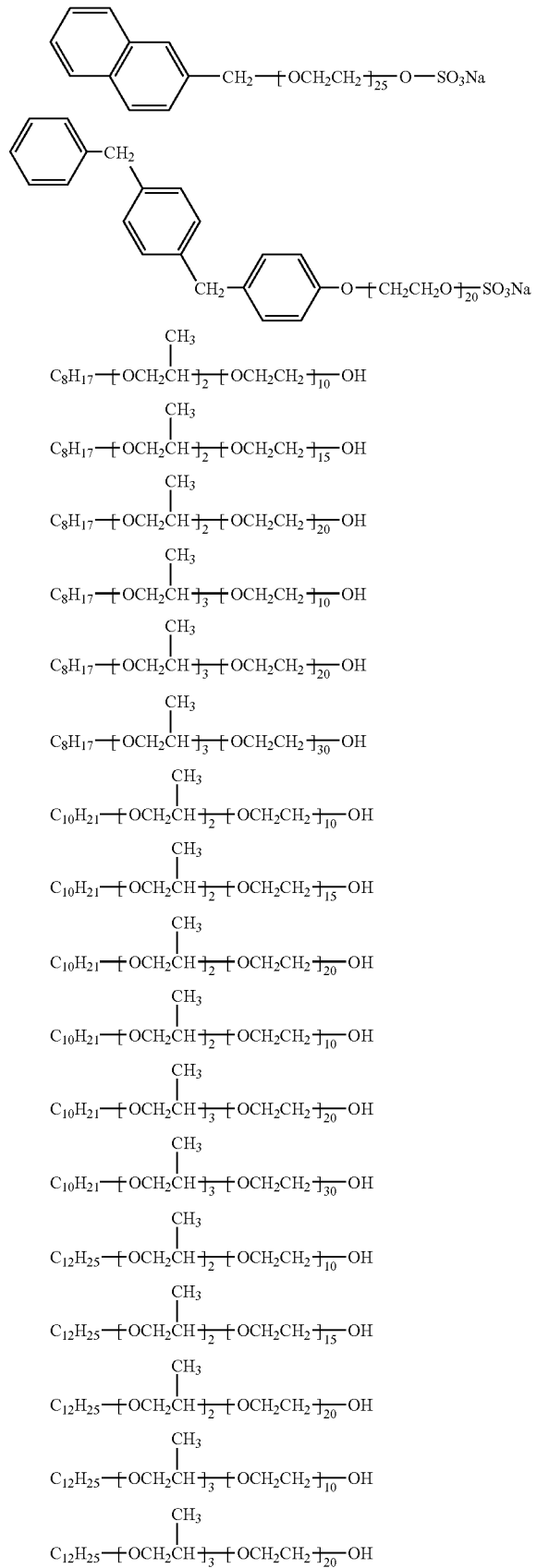
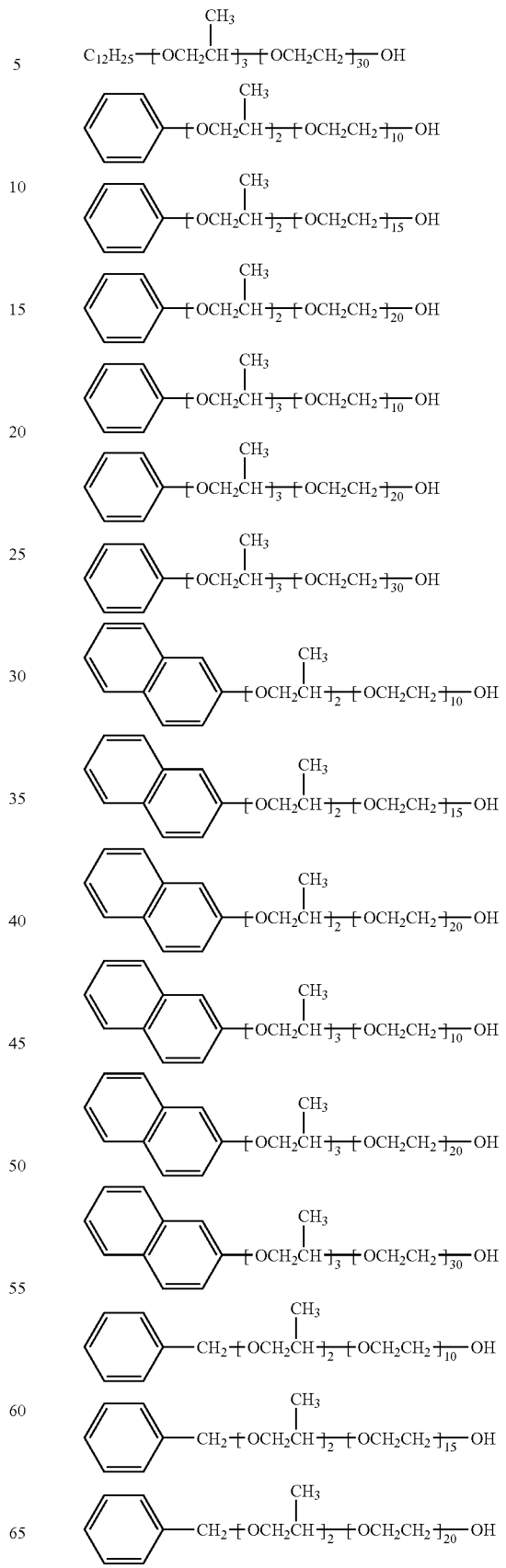

-continued

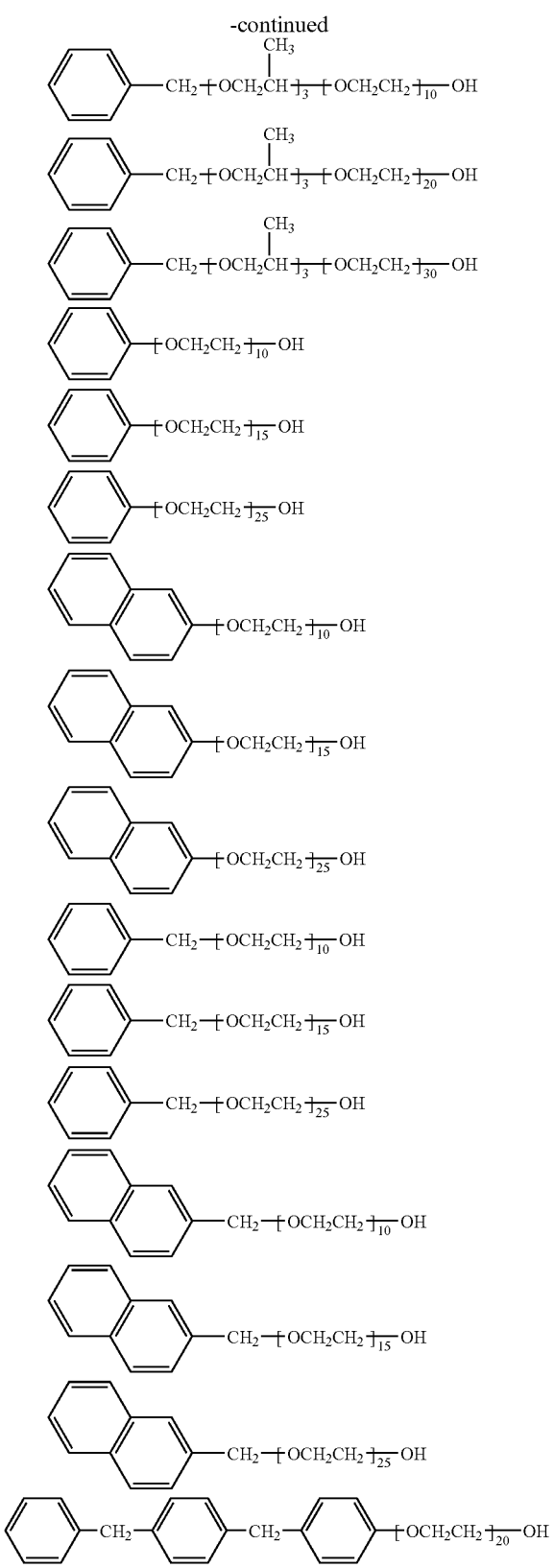

The developer preferably contains the surfactant in an amount of preferably from 0.2 to 30% by weight, and more preferably from 0.3 to 15% by weight.

In an embodiment of the invention, the developer is preferably replenished with a developer replenisher during development of light sensitive planographic printing plate materials. The developer refers to a developer (so-called working developer) replenished with the developer replenisher in order to maintain activity of the developer which lowers during development of light sensitive planographic printing plate materials, as well as a fresh developer used at the beginning of development. The developer replenisher is required to be higher in activity (for example, in alkali agent concentration) than the working developer, and may have a pH exceeding 13.0.

The developer or developer replenisher used in the invention optionally contains a surfactant, an organic solvent, a development stabilizing agent, or a reducing agent.

(Photopolymerization Initiator)

The photopolymerization initiator used in the light sensitive layer of the light sensitive planographic printing plate material is a compound capable of initiating polymerization of a polymerizable ethylenically unsaturated compound by light exposure. Examples thereof include, a dibromomethyl group-containing compound, a tribromomethyl group-containing compound, a titanocene compound, a monoalkyltriaryl borate compound, and an iron arene complex.

The dibromomethyl group-containing compound or tribromomethyl group-containing compound is preferably a bromine compound represented by formula (1) or (2) below. Formula (1)

$$R_2-CBr_2-(C=O)-R_3$$

wherein $R_2$ represents a hydrogen atom, a bromine atom, an alkyl group, an aryl group, an acyl group, an alkylsulfonyl group, an arylsulfonyl group or a cyano group; $R_3$ represents a monovalent substituent, provided that $R_2$ and $R_3$ may combine with each other to form a ring. Formula (2)

$$CBr_3-(C=O)-X-R_4$$

wherein $R_4$ represents a monovalent substituent; X represents —O— or —$NR_5$—, in which $R_5$ represents a hydrogen atom or an alkyl group, provided that $R_4$ and $R_5$ may combine with each other to form a ring.

As the titanocene compounds, there are compounds disclosed in Japanese Patent O.P.I. Publication Nos. 63-41483 and 2-291. Preferred examples thereof include bis(cyclopentadienyl)-Ti-dichloride, bis(cyclopentadienyl)-Ti-bisphenyl, bis(cyclopentadienyl)-Ti-bis-2,3,4,5,6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, bis(methylcyclopentadienyl)-Ti-bis-2,3,4,5,6-pentafluorophenyl, bis(methylcyclopentadienyl)-Ti-bis-2,3,5,6-tetrafluorophenyl, bis(methylcyclopentadienyl)-Ti-bis-2,4-difluorophenyl (IRUGACURE 727L, produced by Ciba Specialty Co., Ltd.), bis(cyclopentadienyl)-bis(2,6-difluoro-3-(pyry-1-yl)phenyl) titanium (IRUGACURE 784, produced by Ciba Specialty Co., Ltd.), bis(cyclopentadienyl)-bis(2,4,6-trifluoro-3-(pyry-1-yl)phenyl) titanium, and bis (cyclopentadienyl)-bis (2,4,6-trifluoro-3-(2,5-dimethylpyry-1-yl)phenyl) titanium.

As the monoalkyltriaryl borate compounds, there are those described in Japanese Patent O.P.I. Publication Nos. 62-150242 and 62-143044. Preferred examples of the monoalkyl-triaryl borate compounds include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

As the iron arene complexes, there are those described in Japanese Patent O.P.I. Publication No. 59-219307. Preferred examples of the iron arene complex include η-benzene-(η-cyclopentadienyl) iron. hexafluorophosphate, η-cumene)-(η-cyclopentadienyl) iron. hexafluorophosphate, η-fluorene-(η-cyclopentadienyl) iron. hexafluorophosphate, η-naphthalene-(η-cyclopentadienyl) iron. hexafluorophosphate, η-xylene-(η-cyclopentadienyl) iron. hexafluorophosphate, and η-benzene-(η-cyclopentadienyl) iron.hexafluoroborate.

Another photopolymerization initiator can be used in combination. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No. 1,459,563.

Typical examples of the photopolymerization initiator used in combination include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis(dimethylamino)benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in-Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I. Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344.

When a laser is used as a light source for exposure, the light sensitive layer preferably contains a sensitizing dye. As the sensitizing dye, a sensitizing dye is preferred which has an absorption maximum in the wavelength or its vicinity of light emitted from the light source.

Examples of the sensitizing dyes, which have sensitivity in the wavelengths of visible to near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, ketoalcohol borate complexes, and compounds disclosed in European Patent No. 568,993, U.S. Pat. Nos. 4,508,811 and 5,227,227, and Japanese Patent O.P.I. Publication Nos. 2001-125255 and 11-271969.

Examples in which the above polymerization initiators are used in combination with the sensitizing dye are disclosed in Japanese Patent O.P.I. Publication Nos. 2001-125255 and 11-271969.

The photopolymerization initiator content of the light sensitive layer is not specifically limited, but is preferably from 0.2 to 20 parts by weight based on the 100 parts by weight of polymerizable compound or cross-linkable compound. The content ratio by mole of the photopolymerization initiator to the sensitizing dye is preferably from 1:100 to 100:1.

(Polymerizable ethylenically Unsaturated Compound)

The polymerizable ethylenically unsaturated compound is a compound capable of being polymerized by imagewise exposure. As such a compound, there are conventional radical polymerizable monomers, polyfunctional monomers having plural ethylenically unsaturated bond, and polyfunctional oligomers.

There are no limitations to such compounds. Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexyl acrylate or 1,3-dioxolanyl acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate or EO-modified products thereof; and a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester(meth)acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A. epichlorhydrin. (meth)acrylic acid or phenol novolak.epichlorhydrin.(meth)acrylic acid obtained by incorporating (meth)acrylic acid in an epoxy resin; an urethaneacrylate such as ethylene glycol. adipic acid. tolylenediisocyanate. 2-hydroxyethylacrylate, polyethylene glycol. tolylenediisocyanate. 2-hydroxyethylacrylate, hydroxyethylphthalyl methacrylate. xylenediisocyanate, 1,2-polybutadieneglycol. tolylenediisocyanate. 2-hydroxyethylacrylate or trimethylolpropane. propylene glycol. tolylenediisocyanate. 2-hydroxyethylacrylate, obtained by incorporating (meth)acrylic acid in an urethane resin; a silicone acrylate such as polysiloxane acrylate, or polysiloxane. diisocyanate. 2-hydroxyethylacrylate; an alkyd modified acrylate obtained by incorporating a methacroyl group in an oil modified alkyd resin; and a spiran resin acrylate.

The light sensitive layer in the invention can contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

As a monomer used in the light sensitive layer, there is a phosphate compound having at least one (meth)acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV•EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In an embodiment of the invention, a compound having a tertiary amino group and an addition polymerizable ethylenically double bond in the molecule is preferably used. The compound is not limited to the chemical structure, and a compound is preferred which is obtained by modifying a tertiary amine having a hydroxyl group with glycidyl methacrylate, methacryloyl chloride or acryloyl chloride. Typically, polymerizable compounds described in Japanese Patent O.P.I. Publication Nos. 1-165613, 1-203413, and 1-197213 are preferably used.

In an embodiment of the invention, a reaction product of a tertiary amine having two or more hydroxyl groups in the molecule, a diisocyanate and a compound having a hydroxyl group and an addition polymerizable ethylenically double bond in the molecule is preferably used.

The tertiary amine having two or more hydroxyl groups in the molecule has a hydroxyl group of preferably from 2 to 6, and more preferably from 2 to 4. Examples of the tertiary amine having two or more hydroxyl groups in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N', N'-tetra-2-hydroxypropylethylenediamine, p-tolyldiethanolamine, N,N,N', N'-tetra-2-hydroxyethylethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule include compounds represented by MH-1 through MH-13 described later, but the invention is not specifically limited thereto. Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

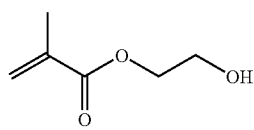

MH-1

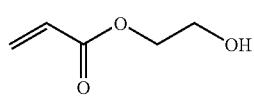

MH-2

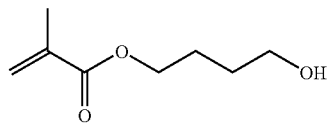

MH-3

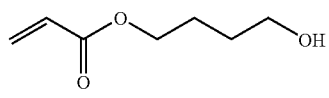

MH-4

-continued

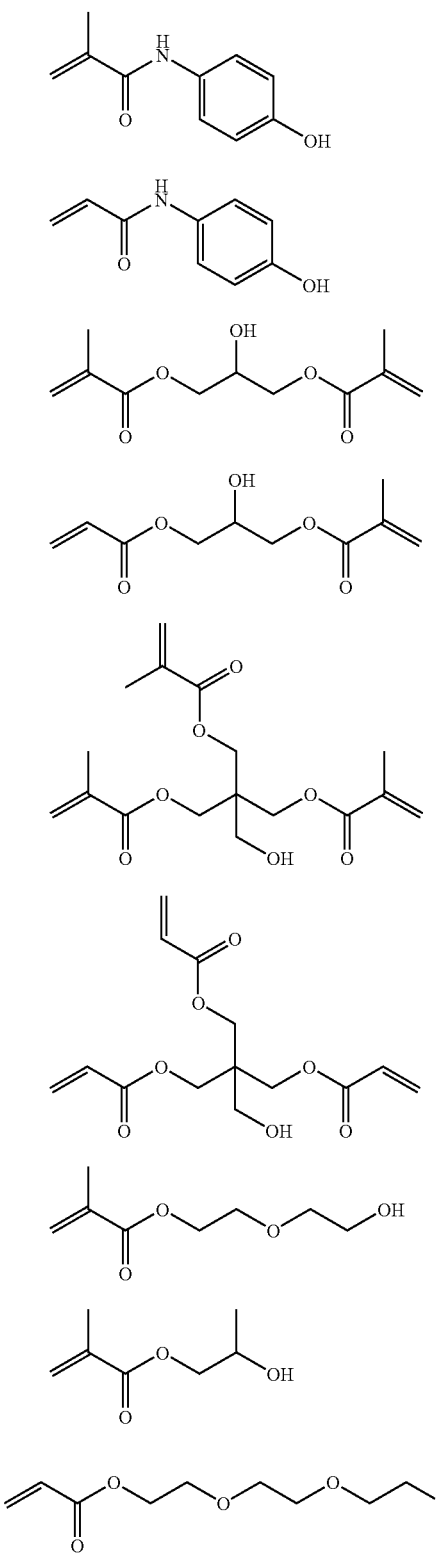

MH-5
MH-6
MH-7
MH-8
MH-9
MH-10
MH-11
MH-12
MH-13

The reaction product can be synthesized according to the same method as a conventional method in which a urethane acrylate compound is ordinarily synthesized employing a diol, a diisocyanate and an acrylate having a hydroxyl group.

Examples of the reaction product of a tertiary amine having two or more hydroxyl groups in the molecule, a diisocyanate having an aromatic ring in the molecule and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

In addition to the above, acrylates or methacrylates disclosed in Japanese Patent O.P.I. Publication Nos. 2-105238 and 1-127404 can be used.

(Polymer Binder)

The polymer binder in the invention is a compound capable of carrying other ingredients in the light sensitive layer. As such a polymer binder, a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin can be used. These resins can be used as an admixture of two or more thereof.

The polymer binder used in the invention is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chloroacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer.

As the polymer binder is also preferred an unsaturated bond-containing copolymer which is obtained by reacting a carboxyl group contained in the above vinyl copolymer molecule with for example, a compound having a (meth) acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The polymer binder content of the light sensitive layer is preferably from 10 to 90% by weight, more preferably from 15 to 70% by weight, and still more preferably from 20 to 50% by weight, in view of sensitivity.

The polymer binder in the invention has an acid value of preferably from 10 to 150, more preferably from 30 to 120, and still more preferably from 50 to 90, in obtaining an optimum polarity of the light sensitive layer. The above acid value range can prevent aggregation of pigments of a light sensitive layer coating liquid.

An oxygen-shielding layer can be provided on the photopolymerizable light sensitive layer of the light sensitive planographic printing plate material in the invention. A water-soluble polymer capable of forming a layer having a low oxygen transmittance is used in the oxygen-shielding layer. Polyvinyl alcohol and/or polyvinyl pyrrolidone are preferably used in the oxygen-shielding layer. Polyvinyl alcohol has the effect of preventing oxygen from transmitting and polyvinyl pyrrolidone has the effect of increasing adhesion between the oxygen-shielding layer and the photopolymerizable light sensitive layer adjacent thereto.

Besides the above two polymers, the oxygen-shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

(Aluminum Support)

A substrate for the aluminum support in the invention is an aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. Further, an aluminum plate manufactured by rolling can be used. A regenerated aluminum plate obtained by rolling aluminum regenerated from scrapped or recycled materials, which has recently spread, can be also used.

It is preferable that the aluminum plate for the aluminum support used in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting plate is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 µm are dispersed in water to the surface of the support. The honing roughening method is carried out by ejecting obliquely slurry with pressure applied from nozzles to the surface of the support, the slurry containing volcanic ash particles with a particle size of 10 to 100 µm dispersed in water. A surface roughening can be also carried out by laminating a support surface with a sheet on the surface of which abrading particles with a particle size of from 10 to 100 µm was coated at intervals of 100 to 200 µm and at a density of $2.5 \times 10^3$ to $10 \times 10^3/cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method in which the support is electrolytically surface roughened in an acidic electrolytic solution. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 $A/dm^2$, and is preferably from 20 to 100 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C. The hydrochloric acid concentration in the electrolytic solution is preferably from 0.1% by weight to 5% by weight. The electrolytic solution can contain a nitrate, a chloride, amines, aldehydes, phosphoric acid, chromic acid, boric acid, acetic acid, or oxalic acid as necessary.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 $A/dm^2$ to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 $mg/dm^2$, and preferably 10 to 40 $mg/dm^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dichromate solution, a nitrite solution and an ammonium acetate solution.

Polyvinyl phosphonic acid can be coated on the surface of the resulting aluminum support. As the coating method, there is for example, a coating method, a spraying method, or a dipping method. The dipping method is preferred in that the facility is cheap. An aqueous polyvinyl phosphonic acid solution used in the dipping method is preferably an aqueous 0.05 to 3% by weight polyvinyl phosphonic acid solution. In the dipping method, the support is dipped in the aqueous polyvinyl phosphonic acid solution at a temperature of preferably from 20 to 90° C. for preferably from 10 to 180 seconds.

It is preferred that after the coating treatment, excessive polyvinyl phosphonic acid is removed from the support surface by washing or squeegeeing. It is preferred that the resulting support is further dried. The drying temperature is preferably from 20 to 95° C. The coating amount of polyvinyl phosphonic acid on the aluminum support surface is preferably from 3 to 15 mg/m$^2$, and more preferably from 3.5 to 10 mg/m$^2$. The desired coating amount of polyvinyl phosphonic acid can be obtained employing an appropriate combination of polyvinyl phosphonic acid concentration, processing temperature, and processing time.

(Exposure)

The light sources for the imagewise exposure include, for example, a laser, an emission diode, a xenon flush lamp, a halogen lamp, a carbon arc light, a metal halide lamp, a tungsten lamp, a high pressure mercury lamp, and a non-electrode light source.

When the light sensitive planographic printing plate material is imagewise exposed at one time, a mask material having a negative image pattern made of a light shielding material is provided on the light sensitive layer to be in close contact with the light sensitive layer, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

EXAMPLES

Next, the present invention will be explained employing examples, but is not limited thereto. In the examples, "parts" represents "parts by weight", unless otherwise specified.

(Synthesis of Acryl Copolymer 1)

Thirty parts of methacrylic acid, 50 parts of methyl methacrylate, 20 parts of ethyl methacrylate, 500 parts of isopropyl alcohol, and 3 parts of α,α'-azobisisobutyronitrile were put in a three neck flask under nitrogen atmosphere, and reacted under nitrogen atmosphere for 6 hours at 80° C. in an oil bath. After that, 3 parts of triethylbenzylammonium chloride and 25 parts of glycidyl methacrylate were added to the resulting reaction mixture, and further reacted for 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

(Preparation of Aluminum Support) A 0.3 mm thick aluminum plate (material 1050, refining H16) was degreased at 65° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, desmut at 60° C. for 10 seconds in a 5% sodium hydroxide solution. The desmut aluminum plate was anodized at 25° C. for 1 minute at a current density of 10 A/dm$^2$ at a voltage of 15 V in a 15% sulfuric acid solution, and further subjected to hydrophilization employing 75° C. hot water. Thus, an aluminum support was obtained.

(Preparation of Light Sensitive Planographic Printing Plate Material Sample)

The following photopolymerizable light sensitive layer coating liquid 1 was coated on the support obtained above, using a wire bar, and dried at 95° C. for 1.5 minutes to give a photopolymerizable light sensitive layer with a dry thickness of 1.5 g/m$^2$.

| (Photopolymerizable light sensitive layer coating liquid 1) | |
|---|---|
| Polymerizable ethylenically unsaturated compound M-3 (described previously) | 25.0 parts |
| Polymerizable ethylenically unsaturated compound NK Ester 4G (produced by Shinnakamura Kagaku Co., Ltd.) | 25.0 parts |
| Polymerization initiator T-1 | 2.0 parts |
| Polymerization initiator T-2 | 2.0 parts |
| Polymerization initiator BR-22 | 1.0 part |
| Polymerization initiator BR-43 | 1.0 part |
| Sensitizing dye D-1 | 1.5 parts |
| Sensitizing dye D-2 | 1.5 parts |
| Acryl copolymer 1 | 40.0 parts |
| N-Phenylglycine benzyl ester | 4.0 parts |
| Phthalocyanine pigment (MHI 454 produced by Mikuni Sikisosha) | 6.0 parts |
| 2-t-Butyl-6-(3-t-butyl-2-hydroxy-5-methylbenzyl)-4-methylphenyl acrylate (Sumirizer GS produced by Sumitomo 3M Co., Ltd.) | 0.5 parts |
| Fluorine-contained surfactant (F-178K produced by Dainippon Ink Co., Ltd.) | 0.5 parts |
| Methyl ethyl ketone | 80 parts |
| Cyclopentanone | 820 parts |

After that, the following oxygen-shielding layer coating liquid 1 was coated on the resulting photopolymerizable light sensitive layer using an applicator, and dried at 75° C. for 1.5 minutes to obtain an oxygen-shielding layer with a dry thickness of 1.8 g/m$^2$. Thus, a light sensitive planographic printing plate material sample was prepared.

| (Oxygen-shielding layer coating liquid 1) | |
|---|---|
| Polyvinyl alcohol (GL-05 produced by Nippon Gosei Kagaku Co., Ltd.) | 89 parts |
| Water-soluble polyamide (P-70 produced by Toray Co., Ltd.) | 10 parts |

-continued

| (Oxygen-shielding layer coating liquid 1) | |
|---|---|
| Surfactant | 0.5 parts |
| (Surfinol 465 produced by Nisshin Kagaku Kogyo Co., Ltd.) | |
| Water | 900 parts |

T-1

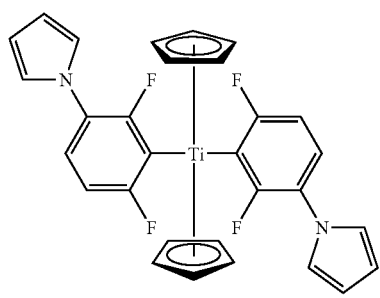

T-2

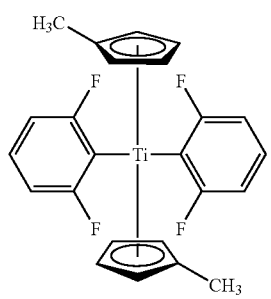

BR22

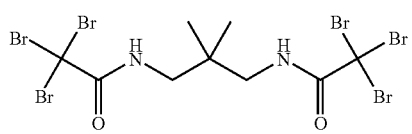

BR43

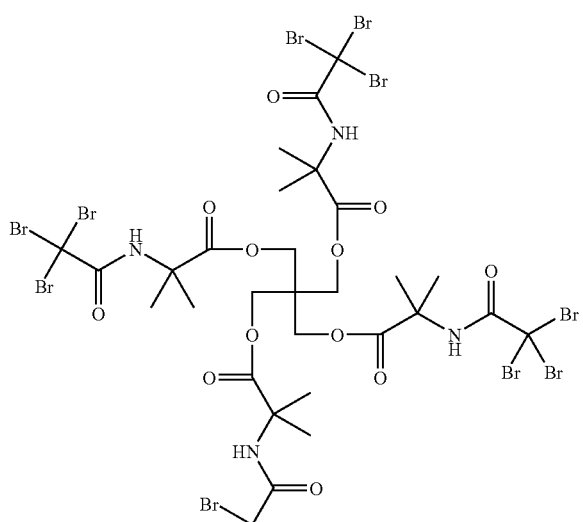

-continued

| (Oxygen-shielding layer coating liquid 1) |
|---|

D-1

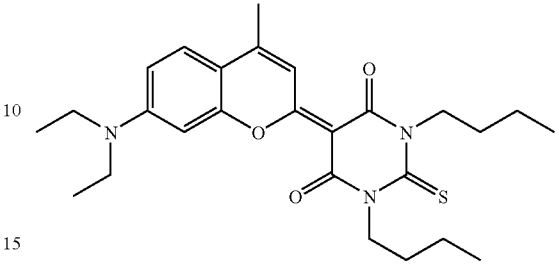

D-2

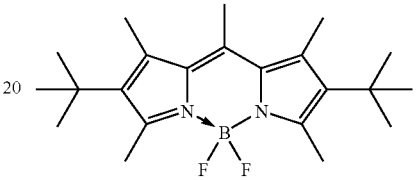

Developer and Developer Replenisher

Developer 1 and developer replenisher 1, employed in Examples 1 through 5 and comparative example 2, are shown below.

| <Developer 1> | |
|---|---|
| Potassium carbonate | 2.5 g/liter |
| Potassium hydrogen carbonate | 5.0 g/liter |
| Polyoxyethylene (13) naphthyl ether | 50.0 g/liter |
| Ethylenediaminetetraacetic acid trisodium salt | 0.5 g/liter |
| Potassium hydroxide | amount providing a pH of 11.4 |

Water was added to make a 1-liter developer.

| <Developer replenisher 1> | |
|---|---|
| Potassium carbonate | 2.5 g/liter |
| Potassium hydrogen carbonate | 5.0 g/liter |
| Polyoxyethylene (13) naphthyl ether | 50.0 g/liter |
| Ethylenediaminetetraacetic acid trisodium salt | 0.5 g/liter |
| Potassium hydroxide | amount providing a pH of 12.4 |

Water was added to make a 1-liter developer replenisher.

Developer 2 and developer replenisher 2 used in Comparative example 1 are shown below.

| <Developer 2> | |
|---|---|
| Aqueous potassium silicate solution (containing 26% by weight of $SiO_2$ and 13.5% by weight of $K_2O$) | 40.0 g/liter |
| Ethylenediaminetetraacetic acid | 0.5 g/liter |
| Surfactant A | 40.0 g/liter. |

-continued

<Developer 2>

| | |
|---|---|
| Potassium hydroxide | amount providing a pH of 12.3 |

Water was added to make a 1-liter developer.

<Developer replenisher 2>

| | |
|---|---|
| Aqueous potassium silicate solution (containing 26% by weight of SiO$_2$ and 13.5% by weight of K$_2$O) | 40.0 g/liter |
| Ethylenediaminetetraacetic acid | 0.5 g/liter |
| Surfactant A | 40.0 g/liter |
| Potassium hydroxide | amount providing a pH of 12.7 |

Water was added to make a 1-liter developer replenisher.

<Plate protecting solution>

| | |
|---|---|
| White dextrin | 5.0% by weight |
| Hydroxypropyl starch | 10.0% by weight |
| Ammonium phosphate | 0.1% by weight |
| Sodium dilauryl succinate | 0.15% by weight |
| Polyoxyethylene naphthyl ether | 0.5% by weight |
| Sodium dedecylbenzene sulfonate | 0.3% by weight |
| Ethylene glycol | 1.0% by weight |
| Ethylenediaminetetraacetic acid disodium salt | 0.05% by weight |
| Ethyl paraben | 0.05% by weight |
| Phosphonic acid compound 1 (Shown in Table 1) | 0.5% by weight |
| Phosphonic acid compound 2 (Shown in Table 1) | 0.5% by weight |

Water was added to make a 1-liter plate protecting solution.

<<Preparation of Planographic Printing Plate Sample>>

In Examples 1, 2, 4, and 5, and Comparative examples 1, 2 and 3, the above-obtained light sensitive planographic printing plate material sample was imagewise exposed at a resolution of 2400 dpi (dpi represents the dot numbers per 2.54 cm) employing a CTP exposure apparatus (Tigercat produced by ECRM Co., Ltd.) installed with an FD-YAG laser source. An image pattern used for imagewise exposure had a solid image and a 50% square dot image with a screen line number of 175.

In Example 3, the light sensitive planographic printing plate material sample was imagewise exposed in the same manner as above, except that a modified plate setter of Tigercat produced by ECRM Co., Ltd., in which the FD-YAG laser source was replaced with a 408 nm laser source with an output power of 30 mW, was employed as the CTP exposure apparatus.

Four hundred square meters of the exposed printing plate material sample were processed to give an area ratio of image portions to non-image portions of 2:8, employing a CTP automatic developing machine (PHW 32-U produced by Technicagraph Co., Ltd.) having (a) a pre-washing section for removing an oxygen-shielding layer before development, (b) a developer tank charged with the developer described above, the developer being replenished with about 60 ml/m$^2$ of the developer replenisher above, (c) a postwashing section for removing a developer remaining on a developed sample after development, and (d) a gumming solution tank charged with the plate protecting solution described above for protecting the surface of the developed sample. Thus, planographic printing plate sample was prepared.

(Anti-Stain Property)

After four hundred square meters of the exposed printing plate material sample were processed as above, another exposed sample was similarly processed. The resulting sample being mounted on the plate cylinder of a printing machine (DAIYA1F-1 produced by Mitsubishi Jukogyo Co., Ltd.), printing was carried out employing a coated paper sheet, dampening water (Etch Solution SG-51 (concentration 1.5%) produced by Tokyo Ink Co., Ltd.) and printing ink (VOC ZERO ink, "TK Hyeco SOY 1" produced by Toyo Ink Manufacturing Co., Ltd.). After five thousand coated paper sheets were printed, printing was stopped for 1 hour, and then printing was resumed to obtain 100 print sheets. The number of spotted stains was counted per 100 cm$^2$ of non-image portions of a one hundredth print after resumption of the print run.

Evaluation was carried out according to the following criteria:

The spotted stain number of not more than 20 is practically non-problematic, the spotted stain number of form more than 20 to less than 30 can be a little problematic for practical use, and a spotted stain number of not less than 30 is problematic for practical use.

(Sludge Stain Prevention Property)

After five hundred square meters of the exposed printing plate material sample were processed as above, employing a CTP automatic developing machine PHW 32-U, sludge produced in the developer tank was visually observed, and evaluated according to the following criteria:

A: Only a slight amount of sludge was observed in the developer tank, but the developer tank could be easily cleaned with flowing water. No sludge stain was observed on the developed sample, which was not practically problematic at all.

B: Some sludge was observed in practically permissible amount, and it was difficult to clean the developer tank with only flowing water, but the tank could be cleaned by rubbing the developer tank with a brush or sponge. No sludge stain was observed on the developed sample, which was not practically problematic at all.

C: Sludge was produced. The circulation pump used for circulating the developer was clogged with the produced sludge and did not work, or sludge was observed on the developed sample, resulting in stain occurrence, which was practically problematic.

The results are shown in Table 1. As is apparent from Table 1, the method according to the invention reduces stain on the printed sheets after resumption of the print run, and further improves a sludge stain prevention property, as compared with the comparative methods.

TABLE 1

| | Developer and developer replenisher | | | Plate protecting solution | | Temperature of | Evaluation | |
|---|---|---|---|---|---|---|---|---|
| | Developer used | Developer replenisher used | SiO$_2$ (wt. %) | Phosphonic acid compound 1 used | Phosphonic acid compound 2 used | plate protecting solution (° C.) | Anti-stain property (number) | Sludge stain prevention property |
| Ex. 1 | 1 | 1 | 0 | D | None | 47 | 16 | A |
| Ex. 2 | 1 | 1 | 0 | E | None | 52 | 16 | A |
| Ex. 3 | 1 | 1 | 0 | D | A | 43 | 12 | A |
| Ex. 4 | 1 | 1 | 0 | D | B | 43 | 11 | A |
| Ex. 5 | 1 | 1 | 0 | D | C | 43 | 11 | A |
| Comparative Ex. 1 | 2 | 2 | 1.0 | D | None | 47 | 14 | B |
| Comparative Ex. 2 | 1 | 1 | 0 | None | None | 47 | 35 | A |

Ex.: Example

Phosphonic acid compound B (Mw: 270):

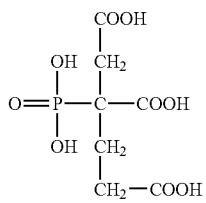

Phosphonic acid compound C (Mw: 436):

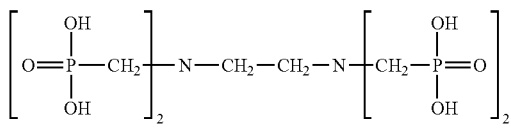

Phosphonic acid compound A (Mw: 206):

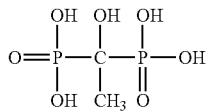

Phosphonic acid compound D (Mw>3,000):

Polyvinyl phosphonic acid

Phosphonic acid compound E (Mw>3,000):

Phosphonic acid-modified starch with a substitution degree of 0.2 (a viscosity at 25° C. of an aqueous 40% by weight starch solution: 300 to 400 cps.)

Surfactant A:

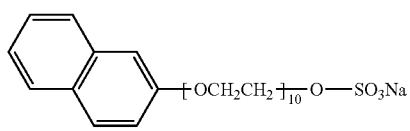

While the preferred embodiments of the present invention have been described using specific terms, such description is for illustrative purposes only, and it is to be understood that changes and variations may be made without departing from the spirit or scope of the appended claims.

What is claimed is:

1. A method of processing a light sensitive planographic printing plate material comprising an aluminum support, and provided thereon, a photopolymerizable light sensitive layer containing a polymerizable ethylenically unsaturated compound, a photopolymerization initiator, and a polymer binder, the method comprising:
    imagewise exposing the light sensitive planographic printing plate material;
    developing the exposed light sensitive planographic printing plate material with a developer to obtain a planographic printing plate, the developer containing no silicate or containing a silicate in amount of not more than 0.1% by weight in terms of SiO$_2$; and
    plate processing the resulting planographic printing plate with a plate protecting solution containing two or more phosphonic acid compounds having different molecular weights at a temperature of from 40 to 90° C., wherein the two or more phosphonic acid compounds are selected from a group consisting of a polyvinyl phosphonic acid, a phospnonic acid-modified starch in which a hydroxyl group in a glucose unit of the starch is reacted with phosphonic acid or its derivative to form an ester, and mixtures thereof.

2. The method of claim 1, wherein the two or more phophonic acids are comprised of a mixture of the polyvinyl phosphonic acid, and the phosphonic acid-modified starch, the molecular weight of the polyvinyl phosphonic acid and phosphonic acid-modified starch being not less than 2000.

3. The method of claim 1, wherein the plate protecting solution contains the two or more phosphonic acid compounds in an amount of from 0.001 to 5% by Weight.

4. The method of claim 3, wherein the plate protecting solution contains the two or more phosphonic acid compounds in an amount of from 0.005 to 2% by weight.

5. The method of claim 1, wherein the plate protecting solution contains a hydrophilic polymer compound.

6. The method of claim 1, wherein the plate protecting solution has a ph of from 2 to 7.

7. The method of claim 1, after the plate processing, further comprising drying the plate processed planographic printing plate at from 35 to 200° C. to form a plate protection layer with a dry thickness of from 0.1 to 1.0 g/m².

8. The method of claim 1, wherein the developer is an aqueous alkaline solution with a pH of from 8.5 to less than 13.0.

9. The method of claim 8, wherein the developer is an aqueous alkaline solution with a ph of from 8.5 to 12.

10. The method of claim 8, wherein the developer is replenished with a developer replenisher having a pH higher than that of the developer.

11. The method of claim 1, wherein the developer contains a surfactant having an oxyalkylene group.

12. The method of claim 11, wherein the surfactant is an anionic surfactant having an oxyethylene group and a hydrophobic group including an alkyl group, in which the molecular weight of the alkyl group is not more than 25% of the molecular weight of the hydrophobic group; a nonionic surfactant having an oxyethylene group and a hydrophobic group including an alkyl group, in which the molecular weight of the alkyl group is not more than 25% of the molecular weight of the hydrophobic group; or a surfactant represented by the following formula:

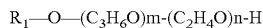

wherein $R_1$ represents a substituted or unsubstituted alkyl group or a substituted or unsubstituted aryl group; m represents an integer of from 1 to 3; and n represents an integer of from 2 to 30.

13. The method of claim 1, wherein the polymerizable ethylenically unsaturated compound is a reaction product of a tertiary amine having two or more hydroxyl groups in the molecule, a diisocyanate, and a compound having a hydroxyl group and an addition polymerizable ethylenically double bond in the molecule; the polymerization initiator is selected from a dibromomethyl group-containing compound, a tribromomethyl group-containing compound, a titanocene compound, a monoalkyltriaryl borate compound, and an iron arene complex; and the polymer binder has an acid value of from 10 to 150.

14. The method of claim 1, wherein an oxygen-shielding layer, containing polyvinyl alcohol or polyvinyl pyrrolidone, is provided on the photopolymerizable light sensitive layer.

15. A method of processing a light sensitive planographic printing plate material comprising an aluminum support, and provided thereon, a photopolymerizable light sensitive layer containing a polymerizable ethylenically unsaturated compound, a photopolymerization initiator, and a polymer binder, the method comprising:

imagewise exposing the light sensitive planographic printing plate material;

developing the exposed light sensitive planographic printing plate material with a developer to obtain a planographic printing plate, the developer containing no silicate or containing a silicate in amount of not more than 0.1% by weight in terms of $SiO_2$; and plate processing the resulting planographic printing plate with a plate protecting solution containing a phosphonic acid compound at a temperature of from 40 to 90° C.; and drying the plate processed planographic printing plate at from 35 to 200° C. to form a plate protection layer with a dry thickness of 0.1 to 0.8 g/m².

16. A method of processing a light sensitive planographic printing plate material comprising an aluminum support, and provided thereon, a photopolymerizable light sensitive layer containing a polymerizable ethylenically unsaturated compound, a photopolymerization initiator, and a polymer binder, the method comprising:

imagewise exposing the light sensitive planographic printing plate material;

developing the exposed light sensitive planographic printing plate material with a developer to obtain a planographic printing plate, the developer containing no silicate or containing a silicate in amount of not more than 0.1% by weight in terms of $SiO_2$; and plate processing the resulting planographic printing plate with a plate protecting solution containing two or more phosphonic acid compounds having different molecular weights at a temperature of from 40 to 90° C., wherein the two or more phosphonic acids are comprised of (a) a polyvinyl phosphonic acid or a phosphonic acid-modified starch in which a hydroxyl group in a glucose unit of the starch is reacted with phosphonic acid or its derivative to form an ester, each having a molecular weight of not less than 2000 and (b) an acid selected from a group consisting of (1) a nitrilotris-methylenephosphonic acid compound, (2) a phosphonoalkanepolycarboxylic acid compound, (3) a hydroxyalkanepolyphosphonic acid compound and (4) an alkanepolyaminepolymethylenephosphonic acid compound, each having a molecular weight less than 2000.

* * * * *